(12) United States Patent
Aikiyo

(10) Patent No.: US 6,396,023 B1
(45) Date of Patent: May 28, 2002

(54) AIRTIGHT SEALING METHOD AND AIRTIGHT SEALING APPARATUS FOR SEMICONDUCTOR LASER ELEMENT

(75) Inventor: Takeshi Aikiyo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/427,116

(22) Filed: Oct. 26, 1999

(30) Foreign Application Priority Data

Oct. 26, 1998 (JP) .......................................... 10-303882

(51) Int. Cl.[7] .............................................. B23K 11/00
(52) U.S. Cl. ..................... 219/117.1; 219/86.9; 219/81; 219/82; 219/83; 219/84; 219/105; 219/107; 134/1; 134/1.3; 134/26; 134/40; 134/39; 257/432; 257/433; 257/81; 257/82; 257/83; 257/84; 438/706; 438/707; 438/708; 438/709; 372/6
(58) Field of Search .................... 219/117.17, 86.9, 219/105, 107, 83, 81, 82, 78.01; 134/1, 1.3, 26, 40, 39; 257/432, 433, 81, 82, 83, 84; 438/706, 707, 708, 709; 372/6

(56) References Cited

U.S. PATENT DOCUMENTS

| | | | | |
|---|---|---|---|---|
| 4,028,135 A | * | 6/1977 | Vig et al. | |
| 4,718,974 A | * | 1/1988 | Minaee | |
| 4,741,787 A | * | 5/1988 | Shimizu et al. | |
| 4,871,416 A | * | 10/1989 | Fukuda | |
| 4,902,868 A | * | 2/1990 | Slee et al. | |
| 5,024,968 A | * | 6/1991 | Engelsberg | |
| 5,392,305 A | * | 2/1995 | Jakobson | |
| 5,474,641 A | * | 12/1995 | Otsuki et al. | |
| 5,480,492 A | * | 1/1996 | Udagawa et al. | |
| 5,513,198 A | | 4/1996 | Jakobson | 372/43 |
| 5,578,863 A | * | 11/1996 | De Poorter | |
| 5,589,007 A | * | 12/1996 | Fujioka et al. | |
| 5,629,952 A | * | 5/1997 | Bartholomew et al. | |
| 5,696,785 A | | 12/1997 | Bartholomew et al. | 372/59 |
| 5,770,473 A | | 6/1998 | Hall et al. | 438/26 |
| 5,981,399 A | * | 11/1999 | Kawamura et al. | |
| 5,998,766 A | * | 12/1999 | Mizosaki et al. | |
| 6,004,180 A | * | 12/1999 | Knall et al. | |
| 6,018,859 A | * | 2/2000 | Borzym et al. | |

FOREIGN PATENT DOCUMENTS

| | | |
|---|---|---|
| EP | 806355 A1 | * 11/1997 |
| JP | 60128644 A | * 9/1985 |

OTHER PUBLICATIONS

Fukuda, Mitsuo, Reliability of High Power Pump Lasers for Erbium–Doped Fiber Amplifiers, 1996, World Scientific, 7, 55–84.*

Kern, Werner (Editor), Handbook of Semiconductor Wafer Cleaning Technology; Vig, John (author), Ultraviolet–Ozone Cleaning Of Semiconductor Surfaces, 1993, Noyes Publications, 218–273, 598–599.*

* cited by examiner

Primary Examiner—Blaine Copenheaver
Assistant Examiner—Hai Vo
(74) Attorney, Agent, or Firm—Lacasse & Associates

(57) ABSTRACT

The present invention provides a method for hermetically sealing a semiconductor laser element, by which the cleanness of a package can be maintained extremely satisfactorily in a stabilized state, in order to prevent organic substances from being adhered to the end faces of high output semiconductor laser elements due to photochemical actions. The method comprises the first step of introducing oxygen into a chamber of a hermetical-sealing apparatus and irradiating ultraviolet rays onto an unsealed package having a semiconductor laser element mounted, in the chamber, and the second step of purging the chamber with an inert gas and hermetically sealing an unsealed package in the inert gas atmosphere without being exposed to the outer atmosphere.

15 Claims, 4 Drawing Sheets

AIRTIGHT SEALING METHOD AND AIRTIGHT SEALING APPARATUS FOR SEMICONDUCTOR LASER ELEMENT

FIELD OF THE INVENTION

The present invention relates to a method for hermetically sealing a high output semiconductor laser element used for an optical fiber amplifier, etc., and a hermetic-sealing apparatus for semiconductor laser elements in the field of optical transmissions.

BACKGROUND OF THE INVENTION

Conventionally, a semiconductor laser module has been frequently utilized as a signal light source and a pumping light source for an optical fiber amplifier in the field of optical transmissions.

In particular, those having wavelength bands of 980 nm, 1020 nm and 1480 nm have been known as a light source module for pumping rare metal doped optical fibers in optical fiber amplifiers. There are many cases where an optical output of more than 100 mW is required with respect to the use of such a light source.

FIG. 1 shows an example of the structure of such a high output semiconductor laser module. In FIG. 1, light emitted from a semiconductor laser element 11 is optically coupled with an optical fiber 12 disposed in proximity of the front end face 11a of the semiconductor laser element 11, and is led to the exterior, where the light is used for an appointed application. The semiconductor laser element 11 is fixed on a thermomodule 14 for adjusting a temperature, and these devices 11 and 14 are hermetically enclosed in a package 13.

In order to produce such high output semiconductor laser modules 10, first, the lower plate 14a of the thermomodule 14 is fixed by soldering on the bottom plate 13b of a package 13. At the thermomodule 14, a lead line 14c is soldered to a lead terminal (not illustrated) of the package 13 for electrical connection with the exterior of the package 13.

Next, a substrate 15 having a fixed semiconductor laser element 11 is soldered to and fixed on the upper plate 14b of the thermomodule 14. An optical fiber 12 is inserted through a through hole 13a provided at the sidewall of the package 13 and is introduced into the interior of the package 13, and is positioned so that most of light from the semiconductor laser element 11 is coupled thereto. And, the optical fiber 12 is fixed on the substrate 15 by YAG laser welding in the positioned state. In addition, the optical fiber 12 is also soldered at the through hole 13a.

After that, a cover 13c is placed on the upper surface of the package 13, and the circumferential portion thereof is welded by resistance welding to be hermetically sealed from the exterior.

OBJECTS AND SUMMARY OF THE INVENTION

A degradation mechanism of a high output semiconductor laser module is a PIF (Packaging Induced Failure).

The PIF is produced by a slight amount of hydrocarbons in the module being subjected to a polymerization reaction by a photochemical reaction and being adhered to the light emitting end face of a semiconductor laser element as solid organic substances. That is, the adhered organic substances absorb a laser light, thereby causing the temperature at the end face of the semiconductor laser element to rise, whereby the end face of the semiconductor laser element is melted and broken.

Herein, hydrocarbons may be ah organic solvent used for cleaning in a production process of semiconductor laser modules, flux used for soldering, etc. Even though a slight amount of hydrocarbons should remain in a package at a ppm level or less, they will become a cause of such a degradation.

The phenomenon results from a photochemical reaction made by a laser light, especially in cases where the optical output from a semiconductor laser element is large, and the laser light has a great optical energy with a very short wavelength. This is a failure mode which remarkably occurs, for example, in a case of 980 nm and 1020 nm bands which emit an optical output of 100 mW or more. A detailed report regarding the failure has been published, for example, "Requirements to avert packaging induced failure of high power 980 nm laser diodes", Jackobson et al, LEOS, November 1993.

In order to prevent a failure of a semiconductor laser element by the PIF, a method for containing oxygen in a hermetically sealed gas 16 of the package 13 has been employed previously.

That is, since polymerization of a slight amount of hydrocarbons in the package can be suppressed due to the existence of oxygen, or by oxidation of the adhered organic substances, the organic substances can be prevented from being accumulated on the end face of the semiconductor laser element.

However, in a prior art high output semiconductor laser module, which is sealed with a sealing gas containing oxygen, although it is possible to prevent organic substances from being adhered to and being accumulated on the light emitting end face of a semiconductor laser element by actions of the oxygen sealed within, water is generated by a reaction of oxygen and the residual hydrocarbons or reaction of oxygen and organic substances adhered to the light-emitting end face, whereby the water content in the package is increased. The water generated is condensed to dew at the light-emitting end face to hinder optical coupling, whereby the optical output is lowered or short-circuits result therefrom in the interior electric wiring.

As a principle, the above phenomenon can be avoided by reducing the amount of the residual organic substances in the package. But, PIF may occur due to the existence of a very slight amount of organic substances at a level of ppm or less. In a fact, it was difficult to repeatedly achieve a very low level of organic substance which does not produce any PIF.

The present invention was developed to propose a method for maintaining the cleanliness of packages in a stabilized state and in a good condition in order to prevent organic substances from being adhered to the end face of the abovementioned high output semiconductor laser element due to photochemical reactions.

That is, a method for hermetically sealing a semiconductor laser element according to a first aspect of the invention comprises a first step of introducing oxygen into a chamber of a hermetic-sealing apparatus and irradiating ultraviolet rays to an unsealed package where a semiconductor laser element is mounted in the chamber; and a second step for purging the inside of the chamber with an inert gas and hermetically sealing an unsealed package in the inert gas atmosphere after the first step is completed.

A method for hermetically sealing a semiconductor laser element according to a second aspect of the invention is featured in that, in the second step of the method for hermetically sealing a semiconductor laser element according to the first aspect, ultraviolet rays are irradiated onto the purging inert gas, and an unsealed package is hermetically sealed in the inert gas atmosphere onto which the ultraviolet rays are irradiated.

A method for hermetically sealing a semiconductor laser element according to a third aspect of the invention comprises a first step for introducing oxygen and an inert gas into a chamber of a hermetic-sealing apparatus and irradiating ultraviolet rays onto an unsealed package having a semiconductor laser element mounted in the chamber, and a second step for hermetically sealing the unsealed package in the atmosphere consisting of the oxygen and inert gas without being exposed to any outer atmosphere.

Further, a method for hermetically sealing a semiconductor laser element according to a fourth aspect of the invention comprises a first step for introducing oxygen and an inert gas into a chamber of a hermetic-sealing apparatus and irradiating ultraviolet rays onto an unsealed package having a semiconductor laser element mounted in the chamber; and a second step for purging the inside of the chamber with the inert gas and hermetically sealing the unsealed package in the inert gas atmosphere after the first step is completed.

Further, a method for hermetically sealing a semiconductor laser element according to a fifth aspect of the invention comprises a step of introducing a package having a semiconductor laser element mounted, into a first chamber of a hermetic-sealing apparatus, introducing oxygen into the first chamber, and irradiating ultraviolet rays onto an unsealed package having a semiconductor laser element mounted; a step of transferring an unsealed package having a semiconductor laser element mounted, from the first chamber which is interrupted from the outer atmosphere, to a second chamber in an inert-gas purged state; and a step of hermetically sealing the unsealed package having a semiconductor laser element mounted, in an inert gas atmosphere in the second chamber.

Further, a method for hermetically sealing a semiconductor laser element according to a sixth aspect of the invention comprises a step of introducing a package having a semiconductor laser element mounted, into a first chamber of a hermetic-sealing apparatus, introducing oxygen into the first chamber, and irradiating ultraviolet rays onto an unsealed package having a semiconductor laser element mounted; a step of blending an inert gas and oxygen by a gas blender having an ultraviolet ray irradiating means while irradiating them and introducing the same into a second chamber, a step of transferring an unsealed package having a semiconductor laser element mounted, from the first chamber which is interrupted from the outer atmosphere, to a second chamber; and a step of hermetically sealing the unsealed package having a semiconductor laser element mounted, in a blended gas atmosphere of the inert gas and oxygen introduced from the gas blender in the second chamber.

With a method for hermetically sealing a semiconductor laser element according to the first through the sixth aspects of the invention, a very slight amount of organic substances remaining in a package can be effectively decomposed and removed by irradiation of ultraviolet rays. In particular, since ultraviolet rays are irradiated onto oxygen, and ozone and excited oxygen atoms are generated, whereby these are reacted with the decomposed organic substances, the effect of removing organic substances is remarkable. Furthermore, since not even a slight amount of organic substances and hydrocarbon contained in the atmosphere of a chamber enter a package during the sealing work, hermetic sealing can be carried out in a very clean atmosphere.

Further, with a method for hermetically sealing a semiconductor laser element according to the second and sixth aspects of the invention, even though a slight amount of, for example, organic substances is contained in an inert gas to be purged, the organic substances in the inert gas can be decomposed and removed by irradiation of ultraviolet rays, whereby it becomes possible to hermetically seal unsealed packages in a clean atmosphere not containing any organic substance. In particular, in a method according to the sixth aspect of the invention, since an inert gas and oxygen, which are introduced into the second chamber are both irradiated by ultraviolet rays in a gas blender, organic substances can be decomposed and removed by ultraviolet rays even though a very slight amount thereof is contained in the inert gas. In addition, since ozone and excited oxygen atoms generated from oxygen by irradiation of ultraviolet rays are reacted with the decomposed organic substances, the organic substances which may be contained in the inert gas can be completely removed, whereby unsealed packages can be hermetically sealed in a very clean atmosphere not having any hydrocarbons and organic substances.

Still further, a method for hermetically sealing a semiconductor laser element according to other aspects of the invention is featured in that, where the semiconductor laser element is hermetically sealed by the method according to the first through the sixth aspects of the invention, an unsealed package is rinsed in advance by an organic solvent before introducing the same into a chamber of a hermetic-sealing apparatus.

According to such a hermetic-sealing method, since a majority of decomposed organic substances in a package are removed by rinsing with an organic solvent and the remaining organic substances removed by ultraviolet rays, it is possible to shorten the period of time for removing organic substances by irradiation of ultraviolet rays in the chamber, thereby improving the working efficiency of hermetically sealing semiconductor laser elements.

An apparatus for hermetically sealing a semiconductor laser element according to the first aspect of the invention comprises a chamber in which an unsealed package having a semiconductor laser element mounted is carried, a means for introducing an inert gas into a chamber, a means for introducing oxygen into the chamber, a means for generating ultraviolet rays in the chamber, and a resistance welder for sealing an unsealed package in the chamber.

Also, an apparatus for hermetically sealing a semiconductor laser element according to the second aspect of the invention comprises a first chamber, a second chamber, and a means for openably partitioning the first chamber and the second chamber, wherein the first chamber has an oxygen introducing means and an ultraviolet ray generating means, and the second chamber has an inert gas introducing means and a resistance welder.

In addition, an apparatus for hermetically sealing a semiconductor laser element according to the third aspect of the invention has a gas blender for blending oxygen and an inert gas to be introduced, and irradiating ultraviolet rays onto the blended gases, wherein the second chamber has a means for introducing blended gases, onto which ultraviolet rays are irradiated, from the gas blender.

A hermetic-sealing apparatus according to the first aspect of the invention executes a hermetic-sealing method according to the first and the fourth aspects, and an apparatus for hermetically sealing a semiconductor laser element according to the second aspect can execute a method for hermetically sealing a semiconductor laser element according to the fifth aspect, and further an apparatus according to the third aspect can execute a method for hermetically sealing a semiconductor laser element according to the sixth aspect.

Therefore, with a method and an apparatus for hermetically sealing a semiconductor laser element according to the present invention, it will become possible to carry out hermetic sealing of semiconductor laser elements in a very clean atmosphere almost free from hydrocarbons and remaining organic substances, whereby PIF can be prevented from occurring, and problems in the prior arts, in which moisture is generated, can be prevented, and it becomes possible to produce semiconductor laser elements having high reliability.

BRIEF DESCRIPTION OF THE DRAWINGS

These and other objects and advantages of the present invention will become more apparent and more readily appreciated from the following detailed description of the exemplary embodiments of the invention taken in conjunction with the accompanying drawings, in which.

DETAILED DESCRIPTION OF THE PREFERRED EMBODIMENT

A detailed description is given of preferred embodiments of the invention with reference to the accompanying drawings.

Figure 1:
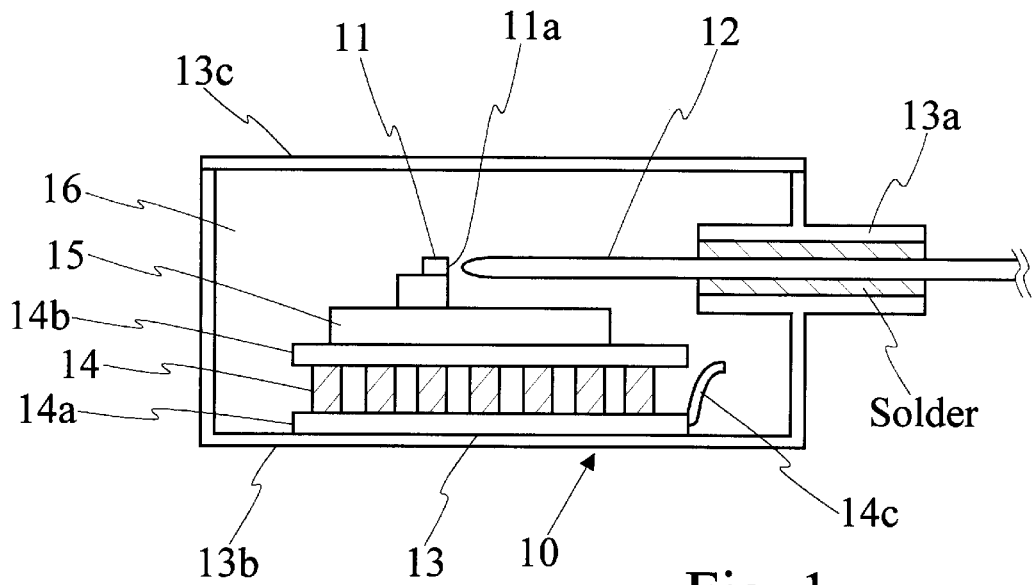
FIG. 1 is a view showing an example of the structure of prior art high output semiconductor laser modules.
Figure 3A:
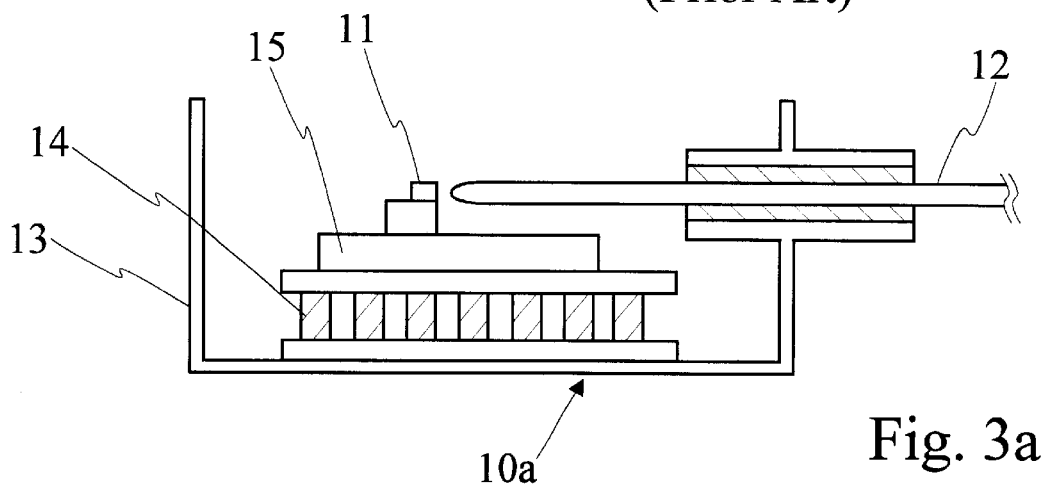
FIGS. 3A and 3B are explanatory views of a method for hermetically sealing a semiconductor laser element according to the invention.
Figure 2:
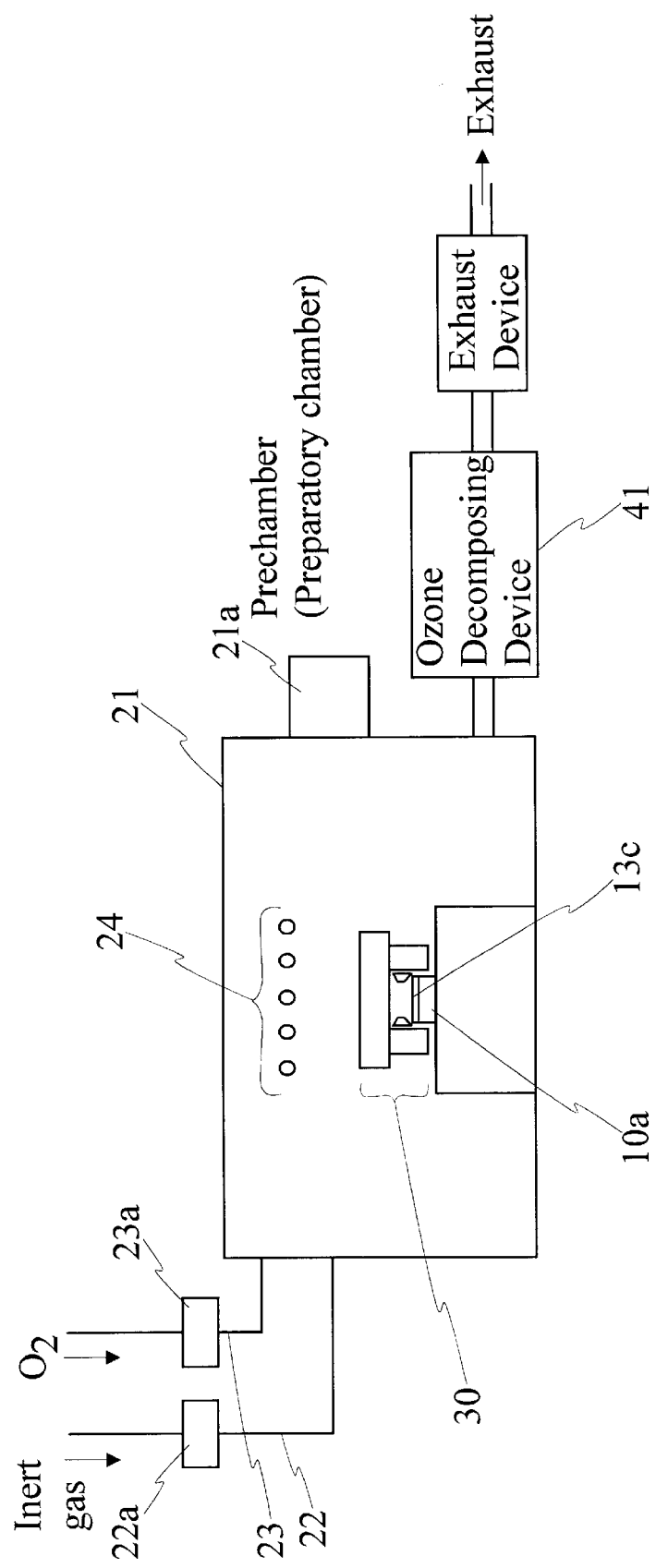
FIG. 2 is a view showing one preferred embodiment of a hermetic-sealing apparatus used for a method for hermetically sealing a semiconductor laser element according to the invention.

FIG. 2 is a view showing one preferred embodiment of a hermetic-sealing apparatus used for a method for hermetically sealing a semiconductor laser element according to the invention.

Where hermetically sealing a semiconductor laser element by an apparatus illustrated in FIG. 2, first, an unsealed module 10a shown in FIG. 3A, in which a thermomodule 14, a substrate 15, a semiconductor laser element 11, and an optical fiber 12 are fixed, is prepared. Herein, the unsealed module 10a means an unsealed package defined in the claims.

An unsealed module 10a thus prepared is transferred into a chamber 21 of a hermetic-sealing apparatus via a prechamber 21a.

The chamber 21 has an inert gas introducing pipe 22 as an inert gas introducing means, and an oxygen introducing pipe 23 as an oxygen introducing means, in which the flow amount of gases flowing into the chamber 21 is controlled by respective flow amount regulating means 22a and 23a. By regulating the oxygen and inert gas to appointed flow amounts, the oxygen ratio in the atmospheric gases and the total pressure in the chamber are controlled.

A lamp 24 for generating ultraviolet rays is further provided in the chamber 21. A synthetic quartz low voltage mercury lamp which is capable of emitting ultraviolet rays whose wavelengths are 185 nm and 254 nm may be used as the lamp.

Further, the chamber 21 has an ozone decomposing device 41 at its exhaust side, and gases treated in the chamber 21 are discharged to the outer atmosphere via the ozone decomposing device 41.

After the unsealed package 10a is transferred into the chamber 21, nitrogen and oxygen are introduced thereinto through the inert gas introducing pipe 22 and oxygen introducing pipe 23 via the flow amount regulating means 22a and 23a, and ultraviolet rays are irradiated from the ultraviolet ray lamp 24.

Optical energy whose wavelengths are 185 nm and 254 nm, emitted from the ultraviolet ray lamp 24, can break coupling of almost all organic substances, whereby the free radicals of organic substances and particles which are in an excited state are produced. Therefore, by irradiating ultraviolet rays onto the unsealed package 10a, chemical coupling of organic substances adhered to the unsealed package 10a are broken.

Further, as ultraviolet rays whose wavelength is 185 nm, emitted from the ultraviolet ray lamp 24, are absorbed by oxygen, ozone is generated. In addition, as ultraviolet rays whose wavelength is 254 nm are absorbed by ozone, excited oxygen atoms are generated.

Ozone and excited oxygen atoms having strong oxidation power react with the free radicals of organic compounds and particles in an excited state, which are generated by irradiation of ultraviolet rays, whereby volatile substances such as $CO_2$ and $H_2O$ are generated. Thus, organic substances adhered to the unsealed package 10a can be almost completely decomposed and removed.

Therefore, after unsealed packages 10a are rinsed in advance with an organic solvent such as isopropylalcohol before being transferred into the chamber 21. During the transfer they are dried by acetone, methanol, pure water, etc., whereby reducing to a low level before irradiating ultraviolet rays the amounts of organic substances such as soldering flux, etc., used in an assembling process and adhering to the packages 10a in the atmosphere. The unsealed packages 10a are treated with respect to organic substances by irradiating ultraviolet rays as described above.

Figure 3B:
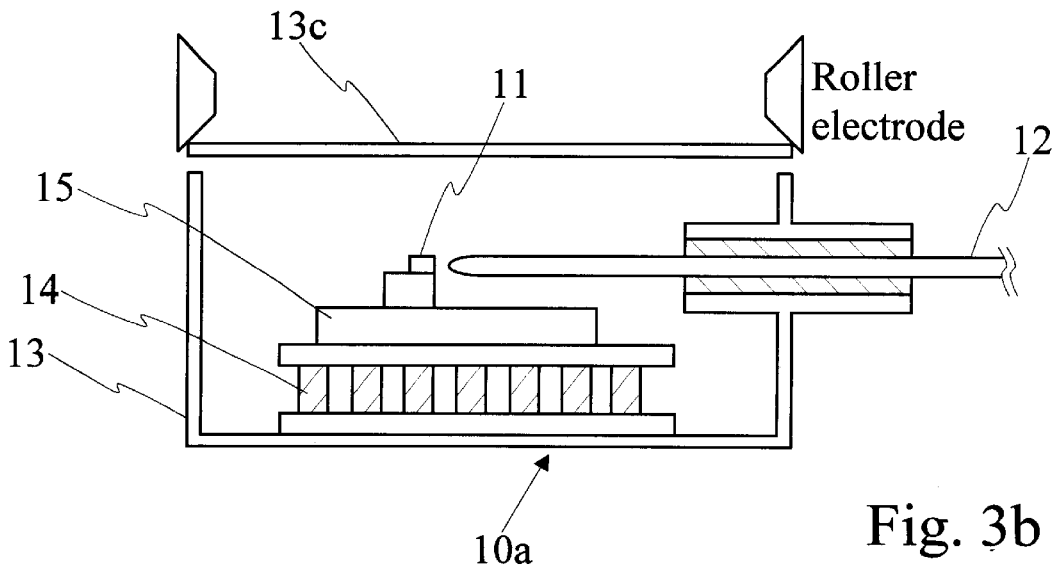

Thus, after the organic substances are thus decomposed and removed, gases in the chamber 21 are discharged to the outer atmosphere via the ozone decomposing device 41. Subsequently, the inside of the chamber 21 is purged with an inert gas such as nitrogen, helium, etc. And, as shown in FIG. 3B, a cover 13c is placed on the unsealed package 10a. The circumference of the cover 13c is welded by a resistance welder 30 placed in the chamber 21.

Since sealing in a hermetic state is thus carried out in a state where the package 10a is kept very clean without being exposed to the outer atmosphere after organic substances are decomposed and removed, a semiconductor laser module 10 can be produced, which internally has almost no organic substances remaining.

Further, usually, although an inert gas introduced into the chamber 21 is supplied from a gas cylinder or from a tank located outside a factory, there are cases in that a very slight amount of hydrocarbons is contained therein, wherein such a very slight amount of hydrocarbons may cause PIF.

Therefore, oxygen and an inert gas are introduced into the chamber 21, and ultraviolet rays are irradiated onto an unsealed package 10a in the chamber 21. After that, the unsealed package 10a is hermetically sealed in the oxygen and inert gas atmosphere-containing chamber 21 without being exposed to the outer atmosphere. Thereby, a very slight amount of organic substances which may be contained in an inert gas introduced is decomposed and removed by ultraviolet rays. Therefore, it is possible to hermetically seal unsealed packages 10a in a further clean atmosphere.

Figure 4:
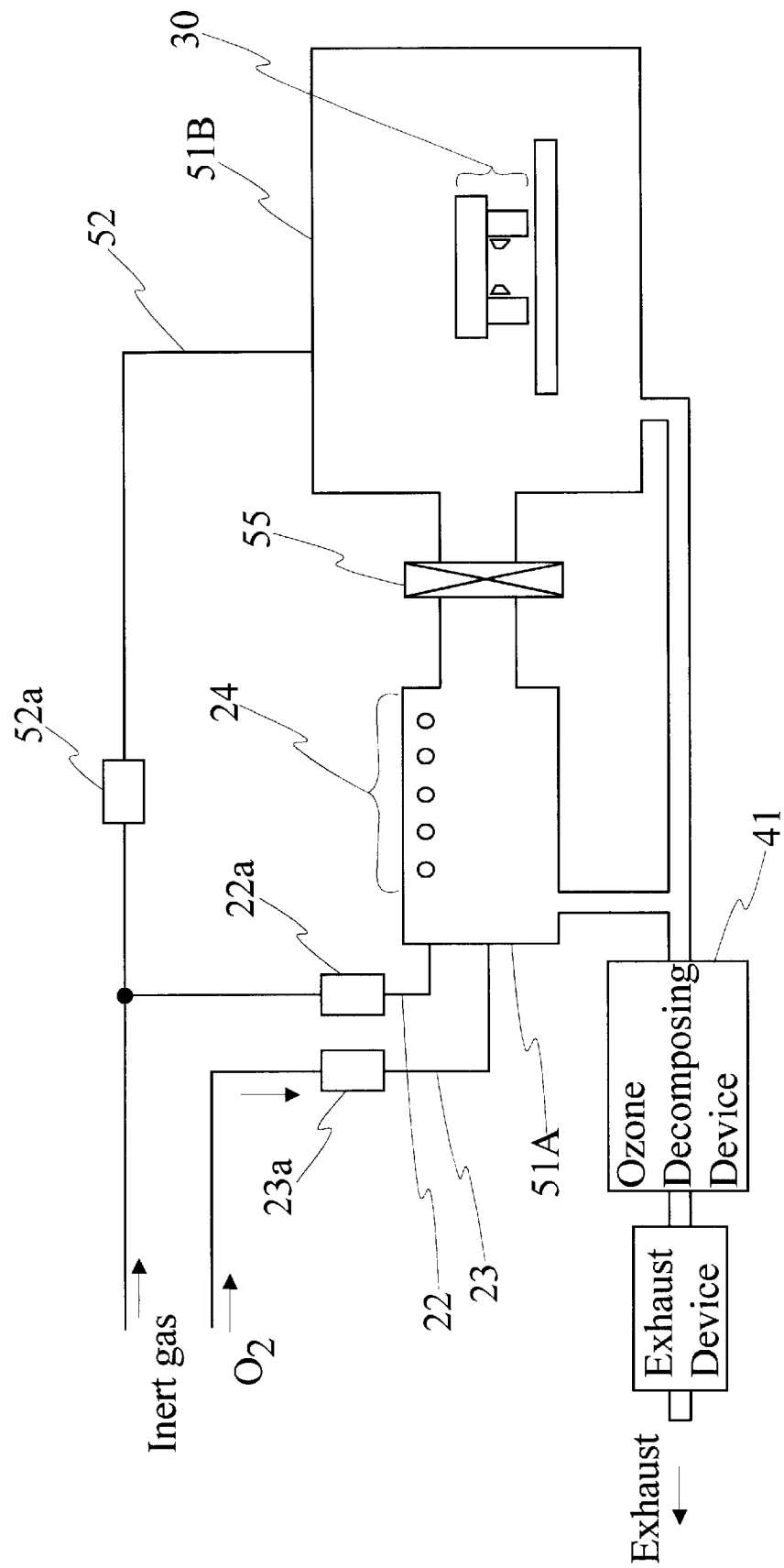
FIG. 4 is a view showing a hermetic-sealing apparatus according to another embodiment used for a method for hermetically sealing a semiconductor laser element according to the invention.

FIG. 4 shows a hermetic-sealing apparatus based on another preferred embodiment, which is used for a method for hermetically sealing a semiconductor laser element according to the invention.

When hermetically sealing a semiconductor laser element by an apparatus illustrated in FIG. 4, first, an unsealed module 10a, shown in FIG. 3A, in which a thermomodule 14, a substrate 15, a semiconductor laser element 11, and an optical fiber 12 are fixed, is prepared.

The unsealed module 10a thus prepared is introduced into the first chamber 51A of a hermetic-sealing apparatus.

The first chamber 51A has an inert gas introducing pipe 22 and an oxygen introducing pipe 23, in each of which the flow amount of gases into the first chamber 51A is controlled by respective flow amount regulating means 22a and 23a. By regulating the inert gas and oxygen to appointed flow amounts, the oxygen ratio in the atmosphere in the chamber 51A and the total pressure therein can be controlled.

A lamp 24 for generating ultraviolet rays is further provided in the first chamber 51A. A synthetic quartz low voltage mercury lamp which is capable of emitting ultraviolet rays whose wavelengths are 185 nm and 254 nm may be used as the lamp.

Further, the chamber 51A has an ozone decomposing device 41 at its exhaust side, and gases treated in the chamber 51A are discharged to the outer atmosphere via the ozone decomposing device 41.

After the unsealed package 10a is transferred into the chamber 51A, nitrogen and oxygen are introduced thereinto through the inert gas introducing pipe 22 and oxygen introducing pipe 23 via the flow amount regulating means 22a and 23a, and ultraviolet rays are irradiated from the ultraviolet ray lamp 24.

Optical energy whose wavelengths are 185 nm and 254 nm, emitted from the ultraviolet ray lamp 24, can break coupling of almost all organic substances, whereby the free radicals of organic substances and particles which are in an excited state are produced. Therefore, by irradiating ultraviolet rays onto the unsealed package 10a, chemical coupling of organic substances adhered to the unsealed package 10a are broken.

Further, as ultraviolet rays whose wavelength is 185 nm, emitted from the ultraviolet ray lamp 24, are absorbed by oxygen, ozone is generated. In addition, as ultraviolet rays whose wavelength is 254 nm are absorbed by ozone, excited oxygen atoms are generated.

Ozone and excited oxygen atoms having strong oxidation power react with the free radicals of organic compounds and particles in an excited state, which are generated by irradiation of ultraviolet rays, whereby volatile substances such as $CO_2$ and $H_2O$ are generated.

Thus, organic substances adhered to the unsealed package 10a can be almost completely decomposed and removed.

The duration of time of treatment required for decomposing and removing such organic substances is determined on the basis of the amount of organic substances adhered to the unsealed packages 10a. Therefore, after unsealed packages 10a are rinsed in advance with an organic solvent such as isopropylalcohol before being transferred into the chamber 51A, and dried while being displaced by acetone, methanol, pure water, etc., the unsealed packages 10a are treated with respect to organic substances by irradiating ultraviolet rays as described above, whereby the amounts of organic substances adhered to the packages 10a in the atmosphere and organic substances such as soldering flux, etc., used in an assembling process, can be suppressed to a low level before irradiating ultraviolet rays. As a result, the duration of time of treatment till hermetically sealing the unsealed packages 10a in the chamber by irradiating ultraviolet rays, can be shortened. That is, an efficient treatment can be carried out.

Thus, after the organic substances are thus decomposed and removed, gases in the chamber 51A are discharged to the outer atmosphere via the ozone decomposing device 41. Subsequently, the inside of the chamber 51A is purged with an inert gas such as nitrogen, helium, etc. Subsequently, the unsealed package 10a is transferred from the first chamber 51A to the second chamber 51B via a gate valve 55 which is an openable isolating means. Also, herein, the second chamber 51B is also purged with nitrogen, helium, etc., through an inert gas introducing pipe 52 acting as an inert gas introducing means.

After that, as shown in FIG. 3B, a cover 13c is placed on the unsealed package 10a in the second chamber 51B. The circumference of the cover 13c is welded by a resistance welder 30 placed in the chamber 51B. Thus, an unsealed package 10a in which a semiconductor laser element 11 is mounted is thus hermetically sealed.

As described above, after organic substances are treated by ultraviolet rays, the semiconductor laser element is hermetically sealed without being exposed to the outer atmosphere. Therefore, a semiconductor laser module having almost no organic substance remaining, which is kept in a very clean state, can be produced. As a matter of course, it is needless to say that, after the semiconductor laser module is hermetically sealed, oxygen and remaining organic substances are reacted with each other to cause moisture to be generated.

Further, in general, although an inert gas is supplied from a gas cylinder or from a tank outside a factory, there are cases where a very slight amount of organic substances is included in the inert gas, and such a very slight amount of organic substances may cause PIF.

Figure 5:
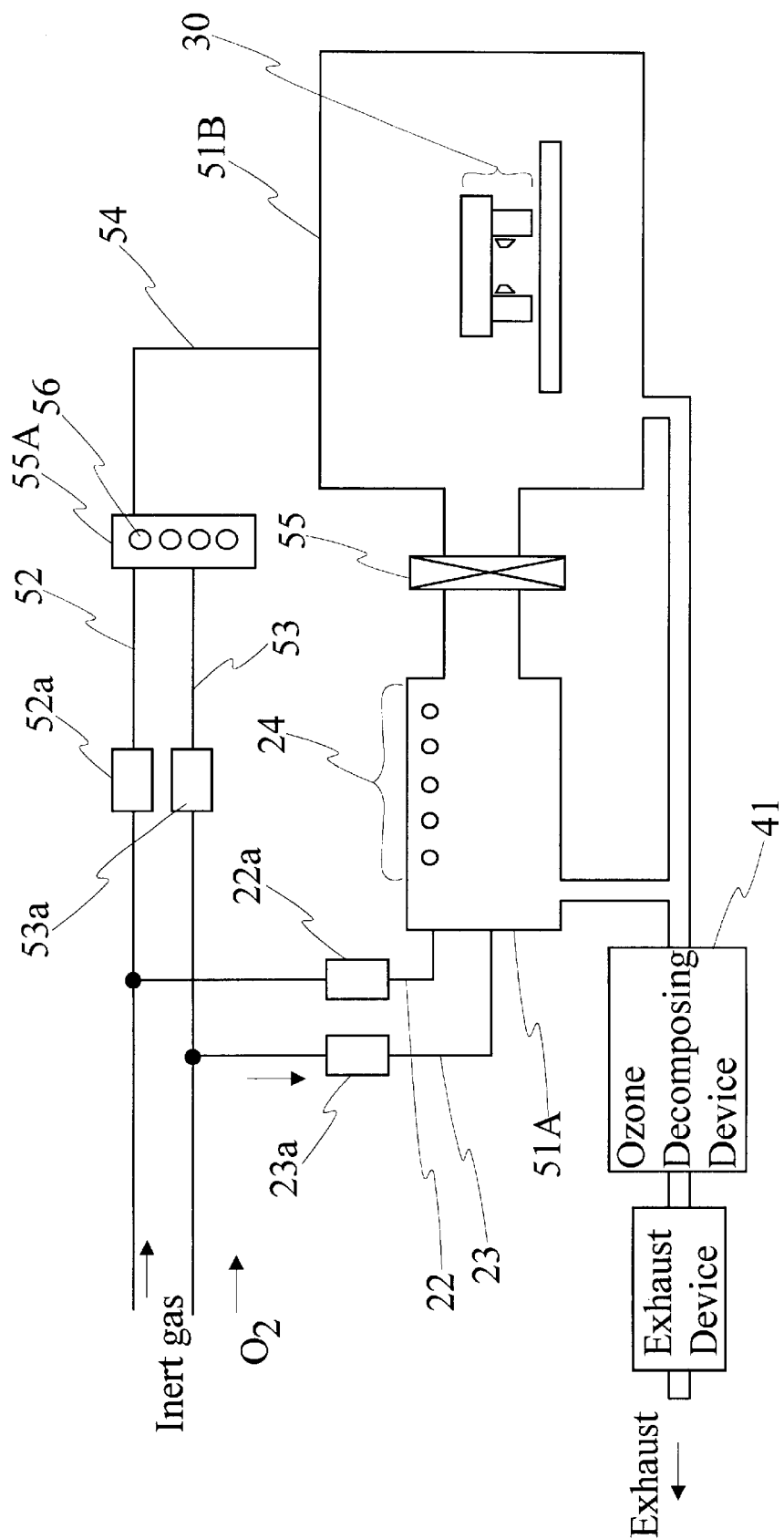
FIG. 5 is a view showing an apparatus for hermetically sealing a semiconductor laser element according to still another embodiment, which is used for a method for hermetically sealing a semiconductor laser element according to the invention.

Therefore, as shown in FIG. 5, the inert gas and oxygen are blended by a gas blender 55A internally having an ultraviolet ray lamp 56, and ultraviolet rays are irradiated thereon to cause them to be decomposed and removed. And, the treated inert gas is introduced into the chamber 51B, wherein, since a very slight amount of inert gas included in the inert gas introduced is decomposed and removed by ultraviolet rays as a semiconductor laser element is hermetically sealed, it is possible to hermetically seal an unsealed package 10a in a further clean atmosphere. In FIG. 5, 52 indicates an inert gas pipe, 52a indicates a flow amount regulating means of an inert gas, 53 indicates an oxygen pipe, 53a indicates a flow amount regulating means of oxygen, 54 indicates a blended gas introducing pipe, respectively.

Also, according to such a hermetic-sealing method, since a package is hermetically sealed in an atmosphere containing ozone, there is another effect by which, where any organic substances remain without being treated in the first chamber 51A, they can be further decomposed and removed. In this case, since organic substances and hydrocarbons are no longer left over in the package although oxygen remains in a hermetically sealed package (in a semiconductor laser module) in the form of ozone, there is no case where moisture is generated in the package by reaction of oxygen with the remaining organic substances, etc. That is, it is possible to provide a semiconductor laser module having high reliability, which can solve the shortcomings and problems in the prior arts, which cause a lowering of optical output and/or short-circuiting of electric wiring due to generation of moisture.

Still further, the present invention is not limited to the respective embodiments described above, but it may be subjected to various modifications. For example, in the respective preferred embodiments, the step of irradiating ultraviolet rays onto an unsealed package 10a is carried out in the blended gas atmosphere of oxygen and an inert gas. But the step may be executed in an atmosphere of oxygen gas. Also, a step of hermetically sealing an unsealed package 10a may be carried out in an atmosphere of inert gas or oxygen gas, or further in an atmosphere of blended gases of oxygen and inert gas.

What is claimed is:

1. A method for hermetically sealing a semiconductor laser element comprises a first step of introducing oxygen into a chamber of a hermetic-sealing apparatus and irradiating ultraviolet rays directly inside an unsealed package to remove a residual organic substance causing a packaging induced failure inside the unsealed package where a semiconductor laser element is mounted in said chamber; and a second step for purging the inside of said chamber with an inert gas and hermetically sealing said unsealed package in said inert gas atmosphere after the first step is completed.

2. A method for hermetically sealing a semiconductor laser element as set forth in claim 1, wherein, in the second step of the method for hermetically sealing a semiconductor laser element, ultraviolet rays are irradiated onto the purging inert gas, and the unsealed package is hermetically sealed in the inert gas atmosphere onto which said ultraviolet rays are irradiated.

3. A method for hermetically sealing a semiconductor laser element as set forth in claim 2, wherein the unsealed package having a semiconductor laser element mounted is rinsed in advance by an organic solvent before being introduced into a hermetic-sealing apparatus.

4. A method for hermetically sealing a semiconductor laser element as set forth in claim 1, wherein the unsealed package having a semiconductor laser element mounted therein is rinsed in advance by an organic solvent before being introduced into a hermetic-sealing apparatus.

5. A method for hermetically sealing a semiconductor laser element comprises a first step for introducing oxygen and an inert gas into a chamber of a hermetic-sealing apparatus and irradiating ultraviolet rays directly inside an unsealed package to remove a residual organic substance causing a packaging induced failure inside the unsealed package having a semiconductor laser element mounted in said chamber, and a second step for hermetically sealing said unsealed package in the atmosphere consisting of oxygen and inert gas.

6. A method for hermetically sealing a semiconductor laser element as set forth in claim 5, wherein the unsealed package having a semiconductor laser element mounted is rinsed in advance by an organic solvent before being introduced into a hermetic-sealing apparatus.

7. A method for hermetically sealing a semiconductor laser element comprises a first step for introducing oxygen and inert gas into a chamber of a hermetic-sealing apparatus and irradiating ultraviolet rays directly inside an unsealed package to remove a residual organic substance causing a packaging induced failure inside the unsealed package having a semiconductor laser element mounted in said chamber; and a second step for purging the inside of said chamber with said inert gas and hermetically sealing said unsealed package in inert gas atmosphere after the first step is completed.

8. A method for hermetically sealing a semiconductor laser element as set forth in claim 7, wherein the unsealed package having a semiconductor laser element mounted is rinsed in advance by an organic solvent before being introduced into a hermetic-sealing apparatus.

9. A method for hermetically sealing a semiconductor laser element comprises a step of introducing an unsealed package having a semiconductor laser element mounted, into a first chamber of a hermetic-sealing apparatus, introducing oxygen into said first chamber, and irradiating ultraviolet rays directly inside the unsealed package to remove a residual organic substance causing a packaging induced failure inside the unsealed package having a semiconductor laser element mounted; a step of transferring the unsealed package having a semiconductor laser element mounted, from said first chamber which is interrupted from the outer atmosphere, to a second chamber in an inert-gas purged state; and a step of hermetically sealing said unsealed package having a semiconductor laser element mounted, in an inert gas atmosphere in said second chamber.

10. A method for hermetically sealing a semiconductor laser element as set forth in claim 9, wherein the unsealed package having a semiconductor laser element mounted is rinsed in advance by an organic solvent before being introduced into a hermetic-sealing apparatus.

11. A method for hermetically sealing a semiconductor laser element comprises a step of introducing an unsealed package having a semiconductor laser element mounted, into a first chamber of a hermetic-sealing apparatus, introducing oxygen into said first chamber, and irradiating ultraviolet rays directly inside the unsealed package to remove a residual organic substance causing a packaging induced failure inside the unsealed package having a semiconductor laser element mounted; a step of blending an inert gas and oxygen by a gas blender having an ultraviolet ray irradiator while irradiating and introducing the unsealed package into a second chamber, a step of transferring the unsealed package having a semiconductor laser element mounted, from said first chamber which is interrupted from the outer atmosphere, to a second chamber; and a step of hermetically sealing said unsealed package having a semiconductor laser element mounted, in a blended gas atmosphere of said inert gas and oxygen introduced from said gas blender in said second chamber.

12. A method for hermetically sealing a semiconductor laser element as set forth in claim 11, wherein the unsealed package having a semiconductor laser element mounted is rinsed in advance by an organic solvent before being introduced into a hermetic-sealing apparatus.

13. An apparatus for hermetically sealing a semiconductor laser element comprising a chamber into which an unsealed packaging having a semiconductor laser element mounted is transferred; a means for introducing an inert gas into said chamber, a means for introducing oxygen into said chamber, a ultraviolet ray generator in said chamber, wherein said ultraviolet ray generator irradiates ultraviolet rays directly inside the unsealed package to remove a residual organic substance causing a packaging induced failure, and having a resistance welder for sealing said unsealed package in said chamber.

14. An apparatus for hermetically sealing a semiconductor laser element comprises a first chamber, a second chamber, and a means for selectively partitioning the first chamber and the second chamber, wherein the first chamber has an oxygen introducing means and an ultraviolet ray generator, and the second chamber has an inert gas introducing means and wherein said ultraviolet ray generator irradiates ultraviolet rays directly inside an unsealed package to remove a residual organic substance in order to prevent a packaging induced failure, and having a resistance welder.

15. An apparatus for hermetically sealing a semiconductor laser element as set forth in claim 14, further having a gas blender for blending oxygen and an inert gas in communication with the second chamber via the inert gas introducing means, the gas blender comprising an ultraviolet ray generator for irradiating the blended gases contained therein prior to introduction into the second chamber.

* * * * *